United States Patent [19]

Rahman

[11] Patent Number: 5,614,352

[45] Date of Patent: Mar. 25, 1997

[54] METAL ION REDUCTION IN NOVOLAK RESINS SOLUTION IN PGMEA BY CHELATING ION EXCHANGE RESIN

[75] Inventor: M. Dalil Rahman, Flemington, N.J.

[73] Assignee: Hoechst Celanese Corporation, Somerville, N.J.

[21] Appl. No.: 366,614

[22] Filed: Dec. 30, 1994

[51] Int. Cl.$^6$ .............................. G03F 7/30; G03F 7/004
[52] U.S. Cl. ...................... 430/270.1; 430/188; 430/326; 430/311; 528/129; 210/660; 210/681; 210/688; 437/229
[58] Field of Search ...................................... 430/188, 270, 430/311, 905, 270.1, 326; 210/660, 681, 688; 528/129; 437/229

[56] References Cited

U.S. PATENT DOCUMENTS

| | | | |
|---|---|---|---|
| 2,929,808 | 4/1956 | Ross et al. | 260/94.9 |
| 4,033,909 | 7/1977 | Papa | 260/482 |
| 4,033,910 | 7/1977 | Papa | 260/25 F |
| 4,195,138 | 3/1980 | Ward | 525/404 |
| 4,250,031 | 2/1981 | Uejima et al. | 210/688 |
| 4,452,883 | 6/1984 | Frenchik et al. | 430/502 |
| 4,567,130 | 1/1986 | Held | 430/294 |
| 4,584,261 | 4/1986 | Held | 430/294 |
| 4,636,540 | 1/1987 | Warfel | 523/310 |
| 4,721,665 | 1/1988 | Dooley et al. | 430/270 X |
| 4,747,954 | 5/1988 | Vaughn et al. | |
| 4,784,937 | 11/1988 | Tanaka et al. | 430/331 |
| 4,833,067 | 5/1989 | Tanaka et al. | 430/331 |
| 4,914,006 | 4/1990 | Kato et al. | 430/331 |
| 5,073,622 | 12/1991 | Wojtech et al. | 528/486 |
| 5,116,715 | 5/1992 | Roland | 430/190 |
| 5,118,787 | 6/1992 | Furuno | 528/482 |
| 5,175,078 | 12/1992 | Aoyama et al. | 430/331 |
| 5,212,044 | 5/1993 | Liang et al. | 430/270 X |
| 5,286,606 | 12/1994 | Rahman et al. | 430/311 |
| 5,300,628 | 4/1994 | Honda | 528/482 |
| 5,350,714 | 9/1994 | Trefonas, III et al. | 210/663 X |
| 5,378,802 | 1/1995 | Honda | 210/660 X |
| 5,446,125 | 8/1995 | Honda et al. | 528/486 |

FOREIGN PATENT DOCUMENTS

| | | |
|---|---|---|
| 544324 | 6/1993 | European Pat. Off. . |
| 544325 | 6/1993 | European Pat. Off. . |
| 1072155 | 3/1989 | Japan . |
| 1-228560 | 9/1989 | Japan . |
| 4-65415 | 3/1992 | Japan . |
| 1509354 | 5/1978 | United Kingdom . |
| 93/12152 | 6/1993 | WIPO . |
| 93/18437 | 9/1993 | WIPO . |
| 94/01807 | 1/1994 | WIPO . |
| 94/12912 | 6/1994 | WIPO . |
| 94/14858 | 7/1994 | WIPO . |
| 94/14863 | 7/1994 | WIPO . |

OTHER PUBLICATIONS

Derwent Publication Ltd., London, GB; JP 05 234 876 (OCG Microelectronic Materials), 10 Sep. 1993.
G. Noti et al, "Deionized Water Plants for Semiconductor Device Fabrication", Proceedings of the Inst: Radio & Electron. Eng, Aust. (Australia), vol. 34, No. 2, Mar. 1973, pp. 45–51.
Bayard; "Water Free of Heavy Metals for Medical Use and Ion Exchange Resin Used in its Preparation"; Nov. 16, 1992; CA98(26).221589z.
Hirai et al; "Treatment of Waste Waters Containing Formaldehyde and Metals with Chelating Ion Exchange Resins"; Nov. 5, 1975; CA84(14):95328j.
Kimura et al; "Purification of Formaldehyde"; Mar. 9, 1977; CA87(7):52776y.
Journal of the Electrochemical Society, vol. 137, No. 12, Dec. 1990, Manchester, New Hampshire US, pp. 393900–3905, XP0001681, T. Tanada "A New Photolithography Tech. w/Antireflective . . . ".
Chemical Abstracts, vol. 112, No. 18, Apr./30/1990, Columbus, OH, p. 17, the Abstract 159201u, JP–1190713 (Inatomi, Shigeki et al) Jul./31/1989.
"Amberlite Ion Exchange Resins Laboratory Guide" by Rohm and HAAS Company, Philadelphia, PA, Sep. 1979.

Primary Examiner—Cynthia Hamilton
Attorney, Agent, or Firm—Andrew F. Sayko, Jr.

[57] ABSTRACT

The present invention provides methods for producing water insoluble, aqueous alkali soluble novolak resins having a very low level of metal ions, utilizing treated chelated ion exchange resins to make the neutral ammonium salt or acid form. A method is also provided for producing photoresist composition having a very low level of metal ions from such novolak resins and for producing semiconductor devices using such photoresist compositions.

14 Claims, No Drawings

METAL ION REDUCTION IN NOVOLAK RESINS SOLUTION IN PGMEA BY CHELATING ION EXCHANGE RESIN

BACKGROUND OF THE INVENTION

The present invention relates to a process for producing phenolic resins having a very low level of metal ions, especially sodium and iron, and for using such phenolic resins in light-sensitive compositions. The present invention also relates to a process for making light-sensitive compositions useful in positive-working photoresist compositions. Further, the present invention relates to a process for coating substrates with these light-sensitive compositions as well as the process of coating, imaging and developing these light-sensitive mixtures on substrates.

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

Metal contamination has been a problem for a long time in the fabrication of high density integrated circuits and computer chips, often leading to increased defects, yield losses, degradation and decreased performance. In plasma processes, metals such as sodium and iron, when they are present in photoresists, can cause contamination especially during plasma stripping. However, these problems have been overcome to a substantial extent during the fabrication process. For example, by utilizing HCL gettering of the contaminants during a high temperature anneal cycle.

As semiconductor devices have become more sophisticated, these problems have become much more difficult to overcome. When silicon wafers are coated with a liquid positive photoresist and subsequently stripped off, such as with oxygen microwave plasma, the performance and stability of the semiconductor device is often seen to decrease. As the plasma stripping process is repeated, more degradation of the device frequently occurs. A primary cause of such problems has been found to be the metal contamination in the photoresist, particularly sodium and iron ions. Metal levels of less than 1.0 ppm in the photoresist have been found to adversely affect the properties of such semiconductor devices.

Novolak resins are frequently used a polymeric binder in liquid photoresist formulations. These resins are typically produced by conducting a condensation reaction between formaldehyde and one or more multi-substituted phenols, in the presence of an acid catalyst, such as oxalic acid. In producing sophisticated semiconductor devices, it has become increasingly important to provide novolak resins having metal contamination levels well below 50 ppb.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating. Thereby uncovering a desired portion of the underlying substrate surface on which the photoresist composition was deposited. On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the now partially unprotected substrate may be treated with a substrate-etchant solution or plasma gases and the like. The etchant solution or plasma gases etch that portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on order of less than one micron are necessary. In addition, most always desirable that the developed photoresist be near vertical relative to the substrate. Such de... between developed and undeveloped areas of the re... translate into accurate pattern transfer of the mask... to the substrate.

SUMMARY OF THE INVENTION

The present invention relates to a process for producing phenol formaldehyde resins containing very low levels of metal ions, especially sodium and iron, and a process for their use in photoresist compositions. The invention further relates to a process for making positive-working photoresists containing these phenol formaldehyde resins and a photosensitizer, and a process for using such photoresists in producing semiconductor devices.

The process of the subject invention provides water insoluble, aqueous alkali soluble novolak resins obtained by condensing with formaldehyde one or more phenolic compounds, such as meta-cresol, para-cresol, 3,5-dimethylphenol or 3,5-xylenol.

The novolak resins obtained have very low levels of metal ions such as iron, sodium, potassium, calcium, magnesium, copper and zinc. The total metal ion level is preferably less than 1 ppm, more preferably less than 500 ppb. Sodium and iron are the most common metal ion contaminants and among the easiest to detect. The level of these metal ions serves as an indicator of the level of other metal ions. The level of sodium and iron ions, are each less than 100 ppb, preferably less than 75 ppb, more preferably less than 50 ppb, even more preferably less than 20 ppb and most preferably less than 5 ppb.

Water insoluble, aqueous alkali soluble novolak resins having a very low levels of metal ions may be obtained by condensing formaldehyde having a very low level of metal ions with one or more phenolic compounds, such as m-cresol, p-cresol, 3,5-dimethyl phenol or 3,5-xylenol, having a very low level of metal ions. The condensation reaction is preferably carried out in the presence of an acid catalyst, such as oxalic acid or maleic anhydride.

Water insoluble, aqueous alkali soluble novolak resins having a very low levels of metal ions may also be obtained by utilizing a chelating ion exchange resin to purify such novolak resins.

U.S. Pat. No. A-5 073 622 discloses a process for producing novolak resins having a total sodium and iron ion level of less than 500 ppb by dissolving the novolak resin in an organic solvent and contacting the solution with aqueous solutions of an acidic complex forming compound.

The claimed invention differs from that process in that the solution of the complex forming agent is replaced by a neutral ammonium form or acid form of chelating ion exchange resin. The acid form is prepared by the sequence: a) treated with DI water and then a mineral acid solution, b) again with DI water, c) with a solvent which is compatible with the novolak resin solvent. For the neutral ammonium form, a) treated with DI water and a mineral acid solution, b) with DI water, c) with ammonium hydroxide solution (4–10%) in DI water, d) with DI water, and e) with a solvent which is compatible with the novolak resin solvent. It further differs in that the acid or ammonium form of chelated ion exchange resin has to be heated with novolak resin solution and filter out the solid phase of ion exchange resin and metals complex. It was proved that without heating metals can not be removed. This was very much unexpected results. Conventionally a chelating ion exchange resin form complex with metals at room temperature in aqueous system, however, in non aqueous system (where water can not be used because of the nature of products, water contamination is not acceptable) the complex does not form. It was unexpectedly discovered that such a complex is formed when it is heated.

DETAILED DESCRIPTION OF THE PREFERRED EMBODIMENT

The present invention provides a process for producing novolak resins having a very low level of metal ions, particularly sodium and iron. In one embodiment, the process utilizes an ammonium salt of chelating ion exchange resin to purify the novolak resin solution in PGMEA solution 2–70%. The process also utilizes an acid form of chelating ion exchange to purify the novolak resin solution 2–70%. The subject process comprises:

a) 1) treating a chelating ion exchange resin in a column or in a batch process with deionized water, followed by a mineral acid solution (e.g. a 5–98% solution of sulfuric, nitric or hydrochloric acid), again treating with DI water, to reduce the level of sodium and iron ions in the ion exchange resin to less than 200 ppb each, preferably less than 100 ppb, more preferably less than 50 ppb and most preferably no more than 20 ppb or 2) treating a chelating ion exchange resin in a column or in a batch process with deionized water, followed by a mineral acid solution (e.g. a 5–98% solution of sulfuric, nitric or hydrochloric acid), again treating with DI water, followed by treating with ammonium hydroxide solution (2–28%) to convert the ion exchange resin to its ammonium salt, followed by again treating with DI water, to reduce the level of sodium and iron ions in the ion exchange resin to less than 200 ppb, preferably less than 100 ppb, more preferably less than 50 ppb and most preferably no more than 20 ppb; treating with electronic grade acetone to remove water, followed by treating with PGMEA to remove acetone;

b) either: 1) passing a hot solution of novolak resin in PGMEA at a temperature of 30° to 150° C., preferably 50° to 120° C., more preferably 60° to 100° C., most preferably 70° to 90° C., through the ammonium chelating ion exchange resin bed at a rate such that the residence time is higher than 200 minutes, preferably higher than 100 minutes, more preferably more than 50 minutes, and most preferably more than 10 minutes and thereby reducing the level of sodium and iron ions in the solution to less than 100 ppb each, preferably less than 50 ppb, more preferably less than 20 ppb, and most preferably less than 5 ppb; or 2) mixing a solution of novolak resin in PGMEA with the treated ammonium salt of the chelated ion exchange resin or the acid form of the chelated ion exchange resin at a temperature in the range of 30° to 150° C., preferably 50° to 120° C., more preferably 60° to 100° C., most preferably 70° to 90° C., for 1 to 80 hours, preferably 3 to 50 hours, more preferably 4 to 25 hours, even more preferably 6 to 15 hours, the most preferably 7 to 12 hours followed by filtering through a 0.01 to 0.2, preferably 0.1 μm filter and thereby reducing the level of sodium and iron ions in the solution to less than 100 ppb each, preferably less than 50 ppb, more preferably less than 20 ppb, and most preferably less than 5 ppb;

c) providing one or more phenolic compounds having a sodium and iron ion content of less than 100 ppb, preferably less than 50 ppb, more preferably less than 20 ppb and most preferably less than 10 ppb;

The present invention further provides a process for producing a positive photoresist composition having a very low level of total sodium and iron ions. The subject process comprises:

a) 1) treating a chelating ion exchange resin in a column or in a batch process with deionized water, followed by a mineral acid solution (e.g. a 5–98% solution of sulfuric, nitric or hydrochloric acid), again treating with DI water, to reduce the level of sodium and iron ions in the ion exchange resin to less than 200 ppb each, preferably less than 100 ppb, more preferably less than 50 ppb and most preferably no more than 20 ppb or: 2) treating a chelating ion exchange resin in a column or in a batch process with deionized water, followed by a mineral acid solution (e.g. a 5–98% solution of sulfuric, nitric or hydrochloric acid), again treating with DI water, followed by treating with ammonium hydroxide solution (2–28%) to convert the ion exchange resin to its ammonium salt, followed by again treating with DI water, to reduce the level of sodium and iron ions in the ion exchange resin to less than 200 ppb each, preferably less than 100 ppb, more preferably less than 50 ppb and most preferably no more than 20 ppb; treating with electronic grade acetone to remove water, followed by treating with PGMEA to remove acetone;

b) either 1 ) passing a hot solution of novolak resin in PGMEA at a temperature of 30° to 150° C., preferably 120° to 50° C., more preferably 60° to 100° C., most preferably 70° to 90° C., through the ammonium chelating ion exchange resin bed at a rate such that the residence time is higher than 200 minutes, preferably higher than 100 minutes, more preferably more than 50 minutes, and most preferably more than 10 minutes and reducing the level of sodium and iron ions in the solution to less than 100 ppb each, preferably less than 50 ppb, more preferably less than 20 ppb, even more preferably less than 10 ppb and most preferably less than 5 ppb; or 2) mixing a solution of novolak resin in PGMEA with the treated ammonium salt of the chelated ion exchange resin or the acid form of the chelated ion exchange resin at a temperature in the range of 30° to 150° C., preferably 50° to 120° C., more preferably 60° to 100° C., most preferably 70° to 90° C., for 1 to 80 hours, preferably 3 to 50 hours, more preferably 4 to 25 hours, even more preferably 6 to 15 hours, most preferably 7 to 12 hours followed by filtering through a 0.01 to 0.02, preferably 0.01 µm filter and reducing the level of sodium and iron ions in the solution to less than 100 ppb each, preferably less than 50 ppb, more preferably less than 20 ppb, even more preferably less than 10 ppb and most preferably less than 5 ppb;

c) providing one or more phenolic compounds having a sodium and iron ion content of less than 100 ppb each, preferably less than 50 ppb, more preferably less than 20 ppb and most preferably less than 5 ppb;

d) providing an admixture of: 1) a photosensitive component in an amount sufficient to photosensitize the photoresist composition; 2) the water insoluble, aqueous alkali soluble novolak resin having a low level of sodium and iron ions and 3) a suitable photoresist solvent.

The invention further provides a method for producing a semiconductor device by producing a photo-image on a substrate by coating a suitable substrate with a positive working photoresist composition by:

a) 1 ) treating a chelating ion exchange exchange resin in a column or in a batch process with deionized water, followed by a mineral acid solution (e.g. a 5–98% solution of sulfuric, nitric or hydrochloric acid), again treating with DI water, to reduce the level of sodium and iron ions in the ion exchange resin to less than 200 ppb each, preferably less than 100 ppb, more preferably less than 50 ppb and most preferably no more than 20 ppb or: 2) treating a chelating ion exchange exchange resin in a column or in a batch process with deionized water, followed by a mineral acid solution (e.g. a 5–98% solution of sulfuric, nitric or hydrochloric acid), again treating with DI water, followed by treating with ammonium hydroxide solution (2–28%) to convert the ion exchange resin to its ammonium salt, followed by again treating with DI water, to reduce the level of sodium and iron ions in the ion exchange resin to less than 200 ppb each, preferably less than 100 ppb, more preferably less than 50 ppb and most preferably no more than 20 ppb;treating with electronic grade acetone to remove water, followed by treating with PGMEA to remove acetone;

b) either: 1 ) passing a hot solution of novolak resin in PGMEA at a temperature of 30° to 150° C., preferably 50° to 120° C., more preferably 60° to 100° C., most preferably 70° to 90° C., through the ammonium chelating ion exchange resin bed at a rate such that the residence time is higher than 200 minutes, preferably higher than 100 minutes, more preferably more than 50 minutes and most preferably more than 10 minutes and reducing the level of sodium and iron ions in the solution to less than 100 ppb each, preferably less than 50 ppb, more preferably less than 20 ppb, even more preferably less than 10 ppb and most preferably less than 5 ppb; or: 2) mixing a solution of novolak resin in PGMEA with the treated ammonium salt of the chelated ion exchange resin or the acid form of the chelated ion exchange resin at a temperature in the range of 30° to 150° C., preferably 50° to 120° C., more preferably 60° to 100° C., most preferably 70° to 90° C., for 1 to 80 hours, preferably 3 to 50 hours, more preferably 4 to 25 hours, even more preferably 6 to 15 hours, most preferably 7 to 12 hours followed by filtering through a 0.01 to 0.2, preferably 0.1 µm filter and reducing the level of sodium and iron ions in the solution to less than 100 ppb each, preferably less than 50 ppb, more preferably less than 20 ppb, even more preferably less than 10 ppb and most preferably less than 5 ppb;

c) providing one or more phenolic compounds having a sodium and iron ion content of less than 100 ppb, preferably less than 50 ppb, more preferably less than 20 ppb and most preferably less than 10 ppb;

d) providing an admixture of: 1) a photosensitive component in an amount sufficient to photosensitize the photoresist composition; 2) the water insoluble, aqueous alkali soluble novolak resin having a low level of total sodium and iron ions and 3) a suitable photoresist solvent.

e) heat treating the coated substrate until substantially all of the solvent is removed; image-wise exposing the photosensitive composition and removing the image-wise exposed areas of such composition with a suitable developer, such as an aqueous alkaline developer. Optionally one may perform a baking of the substrate either immediately before or after the removing step.

It has been found that a novolak resin containing a very low level of metal ion contamination cannot be obtained by first condensing formaldehyde with one or more phenolic compounds, in the presence of an acid catalyst, and then attempting to remove the metal ions from the resin unless: 1) the novolak resin in placed in a solution using a suitable solvent; 2) the chelating ion exchange resin is treated with DI water and a mineral acid solution, and/or ammonium hydroxide solution and water as described above; 3) the ammonium form or acid form of the chelating ion exchange resin is then thoroughly rinsed with a solvent which is the same as or at least compatible with, the novolak resin solvent; 4) the hot novolak resin solution is then passed through the acid form and/or ammonium form of the chelating ion exchange resin bed at a very slow rate so the resin solution is mixed with the acid form or ammonium form of the chelated ion exchange resin and heated.

A chelating ion exchange resin, such as a styrene/divinylbenzene chelating ion exchange resin is utilized in the present process. Such ion exchange resins are available as the sodium form from Rohm and Haas Company, e.g. AMBERLITE® IRC 718 or Chelex® 20 or Chelex® 100 available as sodium form from Bio Rad Co. Before being utilized in the process of the invention, the ion exchange resin must be treated with water and then a mineral acid solution, with water again, ammonium hydroxide solution and followed by water to reduce the metal ion level. Preferably the ion exchange resin is initially rinsed with deionized water, followed by a mineral acid solution such as a 10 percent sulfuric acid solution, rinsed again with deionized water, treated again with the mineral acid solution and once more rinsed with deionized water. Then treated with ammonium hydroxide solution, followed by water. When purifying novolak resin solution, it is critical that the ion exchange resin is then rinsed with a solvent which is the same as, or at least compatible with, the novolak resin solvent.

The novolak resin is passed through a column containing the ammonium form or the acid form of the chelating ion exchange resin as a hot solution, e.g., a solution of about 40 percent novolak resin in propylene glycol methyl ether acetate or such solutions is mixed with the ammonium form or the acid form of chelated ion exchange resin and heated. Such novolak solutions typically contain from 250 to 1000 ppb each of sodium and iron ions. During the process of the present invention, these levels are each reduced to as low as less than 50 ppb each.

The passing of a novolak solution through a ion exchange column must maintain a rate of flow such that the residence time (which is total bed volume divided by flow of rate) is high, i.e., over 10 minutes.

The present invention provides a process for producing a photoresist composition and a process for producing semiconductor devices using such photoresist composition. The photoresist composition is formed by providing an admixture of a photosensitizer, the subject water insoluble, aqueous alkali soluble novolak resin and a suitable solvent. Suitable solvents for such photoresists and for novolak resins may include propylene glycol mono-alkyl ether, propylene glycol alkyl (e.g. methyl) ether acetate, ethyl-3-ethoxypropionate, ethyl lactate, mixtures of ethyl-3-ethoxypropionate and ethyl lactate, butyl acetate, xylene, diglyme, ethylene glycol monoethyl ether acetate. The preferred solvents are propylene glycol methyl ether acetate (PGMEA) and ethyl-3-ethoxypropionate (EEP).

Other optional ingredients such as colorants, dyes, anti-striation agents, leveling agents, plasticizers, adhesion promoters, speed enhancers, solvents and such surfactants as non-ionic surfactants may be added to the solution of novolak resin, sensitizer and solvent before the photoresist composition is coated onto a substrate. Examples of dye additives that may be used together with the photoresist compositions of the present invention include Methyl Violet 2B (C.I. No. 42535), Crystal Violet (C.I. 42555). Malachite Green (C.I. No. 42000), Victoria Blue B (C.I. No. 44045) and Neutral Red (C.I. No. 50040) at one to ten percent weight levels, based on the combined weight of novolak and sensitizer. The dye additives help provide increased resolution by inhibiting back scattering of light off the substrate.

Anti-striation agents may be used at up to about a five percent weight level, based on the combined weight of novolak and sensitizer. Plasticizers which may be used include, for example, phosphoric acid tri-(beta-chloroethyl)-ester; stearic acid; dicamphor; polypropylene; acetal resins; phenoxy resins; and alkyl resins, at about one to ten percent weight levels, based on the combined weight of novolak and sensitizer. The plasticizer additives improve the coating properties of the material and enable the application of a film that is smooth and of uniform thickness to the substrate.

Adhesion promoters which may be used include, for example,beta-(3,4-epoxy-cyclohexyl)-ethyltrimethoxysilane; p-methyl-disilanemethylmethacrylate;inyltrichlorosilane; and gamma-amino-propyl triethoxysilane up to about a 4 percent weight level, based on the combined weight of novolak and sensitizer. Development speed enhancers that may be used include, for example, picric acid, nicotinic acid or nitrocinnamic acid up to about a 20 percent weight level, based on the combined weight of novolak and sensitizer. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhances will also cause a larger loss of photoresist coating from the unexposed areas.

The solvents may be present in the overall composition in an amount of up to 95% by weight of the solids in the composition. Solvents, of course are substantially removed after coating of the photoresist solution on a substrate and drying. Non-ionic surfactants that may be used include, for example, nonylphenoxy poly(ethyleneoxy) ethanol; octylphenoxy ethanol at up to about 10% weight levels, based on the combined weight of novolak and sensitizer.

The prepared photoresist solution, can be applied to a substrate by any conventional method used in the photoresist art, including dipping, spraying, whirling and spin coating. When spin coating, for example, the resist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds.

The photoresist coatings produced by the described procedure are particularly suitable for application to thermally grown silicon/silicon dioxide-coated wafers, such as are utilized in the production of microprocessors and other miniaturized integrated circuit components. An aluminum/aluminum oxide wafer can also be used. The substrate may also comprise various polymeric resins, especially transparent polymers such as polyesters. The substrate may have an adhesion promoted layer of a suitable composition, such as one containing hexa-alkyl disilazane.

The photoresist composition solution is then coated onto the substrate, and the substrate is treated at a temperature from about 70° C. to about 110° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the photosensitizer. In general, one desires to minimize the concentration of solvents and this first temperature treatment is conducted until substantially all of the solvents have evaporated and a thin coating of photoresist composition, on the order of one micron in thickness, remains on the substrate. In a preferred embodiment the temperature is from about 85° C. to about 95° C. The treatment is conducted until the rate of change of solvent removal becomes relatively insignificant. The temperature and time selection depends on the photoresist properties desired by the user, as well as the equipment used and commercially desired coating times. The coating substrate can then be exposed to actinic radiation, e.g., ultraviolet radiation, at a wavelength of from about 300 nm to about 450 nm, x-ray, electron beam, ion beam or laser radiation, in any desired pattern, produced by use of suitable masks, negatives, stencils, templates, etc.

The photoresist is then optionally subjected to a post exposure second baking or heat treatment either before or after development. The heating temperatures may range from about 90° C. to about 120° C., more preferably from about 100° C. to about 110° C. The heating may be conducted for from about 30 seconds to about 2 minutes, more preferably from about 60 seconds to about 90 seconds on a hot plate or about 30 to about 45 minutes by convection oven.

The exposed photoresist-coated substrates are developed to remove the image-wise exposed areas by immersion in an alkaline developing solution or developed by spray development process. The solution is preferably agitated, for example, by nitrogen burst agitation. The substrates are allowed to remain in the developer until all, or substantially all, of the photoresist coating has dissolved from the exposed areas. Developers may include aqueous solutions of ammonium or alkali metal hydroxides. One preferred hydroxide is tetramethyl ammonium hydroxide. After removal of the coated wafers from the developing solution, one may conduct an optional post-development heat treatment or bake to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid base etching solution. The photoresist compositions of the present invention are resistant to acid-base etching solutions and provide effective protection for the unexposed photoresist-coating areas of the substrate.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

Example 1

200 grams of Amberlite® IRC 718 chelating ion exchange resin beads were placed in a conical flask and deionized water was added so that all of the resin beads were under water. The flask was sealed and allowed to stand for half an hour to swell the resin beads. The water was decanted, deionized water added to cover the resin beads and the flask was shaken slowly. The water was again decanted. The rinsing with deionized water and decanting steps were repeated three more times. The resulting slurry of ion exchange resin was poured into a glass column having a diameter equipped with a porous disk and water jacket and a stopcock. The resin was allowed to settle to the bottom and the column was back flushed with deionized water for 25 minutes. The resin was again allowed to settle to the bottom.

The bed length was measured and the bed volume was calculated as 180 ml. A 10 percent sulfuric acid solution was passed down through the resin bed at a rate of about 32 mi./min. 6 bed volumes of the acid solution were passed through the resin bed. Sufficient amount of deionized water were then passed down through the resin bed at about the same flow rate to remove acid. The pH of the effluent water was measured to assure that it matched the pH of 6 for fresh deionized water. 2 bed volumes of electronic grade acetone was passed down through the column to remove water, followed by 2 bed volumes of PGMEA to remove acetone. Hot water (60° C.) was circulated through the jacket so that the temperature of the column bed was 55°–60° C. 300 grams of a 40 percent solution of novolak resin in PGMEA containing about 375 ppb of sodium and about 66 ppb of iron was passed through the resin bed at such a flow rate that the residence time was 35 minutes. The resin solution obtained had a very low level of metal ions as follows: sodium—<5 ppb, iron—23 ppb.

Example 2

Example 1 was repeated and 200 grams of a 40 percent solution of novolak resin in PGMEA containing about 250 ppb of sodium and about 560 ppb of iron was passed down through the resin bed at such a flow rate that the residence time was 90 minutes. The resin solution obtained had a very low level of metal ions as follows: sodium—<5 ppb, iron—18 ppb.

Example 3

200 grams of Amberlite® IRC 718 chelating ion exchange resin beads were placed in a conical flask and deionized water was added so that all of the resin beads were under water. The flask was sealed and allowed to stand for half an hour to swell the resin beads. The water was decanted, deionized water added to cover the resin beads and the flask was shaken slowly. The water was again decanted. The rinsing with deionized water and decanting steps were repeated three more times. The resulting slurry of ion exchange resin was poured into a glass column having a diameter equipped with a porous disk and water jacket and a stopcock. The resin was allowed to settle to the bottom and the column was back flushed with deionized water for 25 minutes. The resin was again allowed to settle to the bottom.

The bed length was measured and the bed volume was calculated as 180 ml. A 10 percent sulfuric acid solution was passed down through the resin bed at a rate of about 32 mi./min. 6 bed volumes of the acid solution were passed through the resin bed. Sufficient amount of deionized water was then passed down through the resin bed at about the same flow rate to remove acid. An ammonium hydroxide solution (6%, 6 bed volumes) was passed through the column at the same rate, followed by DI water (about 60 bed volumes) to remove ammonium hydroxide. The pH of the effluent water was measured to assure that it matched the pH of 6 for fresh deionized water. 2 bed volume of electronic grade acetone was passed down through the column to remove water, followed by 2 bed volumes of PGMEA to remove acetone. Hot water (60° C.) was circulated through the jacket so that the temperature of the column bed was 55°–60° C.

300 grams of a 40 percent solution of novolak resin in PGMEA containing about 225 ppb of sodium and about 255 ppb of iron was passed through the resin bed at such a flow rate that the residence time was 35 minutes. The resin solution obtained had a very low level of metal ions as follows: sodium—15 ppb, iron—20 ppb.

Example 4

200 grams of Amberlite® IRC 718 chelating ion exchange resin beads were placed in a conical flask and deionized water was added so that all of the resin beads were under water. The flask was sealed and allowed to stand for half an hour to swell the resin beads. The water was decanted, deionized water added to cover the resin beads and the flask was shaken slowly. The water was again decanted. The rinsing with deionized water and decanting steps were repeated three more times. The resulting slurry of ion exchange resin was poured into a glass column having a diameter equipped with a porous disk and a stopcock. The resin was allowed to settle to the bottom and the column was back flushed with deionized water for 25 minutes. The resin was again allowed to settle to the bottom.

The bed length was measured and the bed volume was calculated as 320 ml. A 10 percent sulfuric acid solution was passed down through the resin bed at a rate of about 32 ml./min. 6 bed volumes of the acid solution were passed through the resin bed. Sufficient amount of deionized water was then passed down through the resin bed at about the same flow rate to remove acid. An ammonium hydroxide solution (6%, 6 bed volumes) was passed through the column at the same rate, followed by DI water (about 60 bed volumes) to remove ammonium hydroxide. The pH of the effluent water was measured to assure that it matched the pH of 6 for fresh deionized water. 2 bed volumes of electronoc grade acetone was passed through the column to remove water, followed by 2 bed volumes of PGMEA to remove acetone. The ammonium salt of the chelated ion exchange resin and PGMEA slurry was transferred to a metals free bottle.

242 grams of novolak resin solution in PGMEA(40%) containing about 79 ppb of sodium and over 1000 ppb of iron was taken in a metals free flask equipped with stirrer and a thermometer, and 39 grams of the ammonium salt of chelated ion exchange resin was added. It was heated for eight hours at 90° C. on stirring. The mixture was cooled to 40° C. and filtered through 0.2 μm filter. The resin solution obtained had a very low level of metal ions as follows: sodium 15 ppb and iron 66 ppb.

Example 5

Example 3 was repeated and 242 grams of a 40 percent solution of novolak resin in PGMEA containing about 79 ppb of sodium and about 186 ppb of iron was treated. The resin solution obtained had a very low level of metal ions as follows: sodium—10 ppb, iron—17 ppb.

Example 6

Example 3 was repeated and 242 grams of a 40 percent solution of novolak resin in PGMEA containing about 79 ppb of sodium and about 186 ppb of iron was treated. The resin solution obtained had a very low level of metal ions as follows: sodium—11 ppb, iron—14 ppb

Example 7

Example 3 was repeated and 242 grams of a 40 percent solution of novolak resin in PGMEA containing about 45 ppb of sodium and about 222 ppb of iron, 9 ppb of potassium, 79 ppb of calcium, 10 ppb of aluminum, was treated. The resin solution obtained had a very low level of metal ions as follows: sodium—18 ppb, iron—<5 ppb, potassium <5 ppb, calcium, <5 ppb, Aluminum <5 ppb.

Example 8

200 grams of Amberlite® IRC 718 chelating ion exchange resin beads were placed in a conical flask and deionized water was added so that all of the resin beads were under water. The flask was sealed and allowed to stand for half an hour to swell the resin beads. The water was decanted, deionized water added to cover the resin beads and the flask was shaken slowly. The water was again decanted. The rinsing with deionized water and decanting steps were repeated three more times. A 10 percent sulfuric acid solution (300 g) was added and stirred for 30 minutes by magnetic stirrer and then was allowed to settle. The acid solution was decanted. The process was repeated for 3 times. 300 g of DI water was added and stirred for 30 minutes and then allowed to settled. Water was decanted. The process was repeated 3 more times. The same process was repeated with electronic grade acetone to remove water, followed by PGMEA to remove acetone. The chelated ion exchange resin (acid form) and PGMEA slurry was transferred to a metals free bottle.

240 grams of novolak resin solution in PGMEA(40%) containing about 79 ppb of sodium and over 1000 ppb of iron was taken in a metals free flask equipped with stirrer and a thermometer and 35 grams of chelated ion exchange resin (acid form) was added. It was heated for eight hours at 90° C. on stirring. The mixture was cooled to 40° C. and filtered through 0.2μm filter. The resin solution obtained had a very low level of metal ions as follows: sodium 19 ppb and iron 23 ppb.

Comparative Example

Example 1 and example 3 were repeated without heating, and it was found that monovalent metal, such as sodium was reduced by about 50% but multi-valent metal ions such as iron were not reduced at all, i.e., starting at >1000 ppb of iron before treatment and the level of iron remained the same.

Example 9

A 50 gram photoresist test sample was prepared according to the following formulation:

| | |
|---|---|
| RI 292 | 2.51 gm |
| Resin from Example 1 | 11.46 gm |
| PGMEA | 36.00 gm |
| 10% FC-430 PGMEA solution | 0.13 gm |

The Resist sample was coated on a HMDS primed silicon wafer to 1.29 mm thickness using soft bake at 110° C. for 60 seconds on the I line hot plate (SVG 8100). The reference is also coated to 1.29 mm thickness by the same procedure. The exposure matrix is printed on the coated wafers using a 0.54 NA NIKON i-line stepper and a NIKON resolution reticle. The exposed wafers are PEB at 110° C. for 60 seconds on a in line hot plate. The wafers are then developed using AZ® 300 MIF-TMAH developer. The developed wafers are examined by a HITACHI® S-400 SEM. A nominal dose (Dose to Print, DTP) is measured at the best focus, the dose required to precisely replicate a given feature. DTP, resolution and focus latitude were measured and are shown below:

Photospeed 180 mJ/cm$^2$

Resolution 0.4 mm

Depth of focus +0.2/−0.4

I claim:

1. A method for producing a water insoluble, aqueous alkali soluble novolak resin having a very low level of metal ions comprising:

a) 1) treating a chelating ion exchange resin in a column or in a batch process with deionized water, followed by a mineral acid solution again treating said ion exchange resin with deionized water, and thereby reducing the level of sodium and iron ions in said ion exchange resin to less than 200 ppb each; or 2) treating a chelating ion exchange resin in a column or in a batch process with deionized water, followed by a mineral acid solution, again treating with deionized water, followed by treating said ion exchange resin with ammonium hydroxide solution and thereby converting the ion exchange resin to an ammonium salt, followed by again treating said ion exchange resin with deionized water, and thereby reducing the level of sodium and iron ions in said ion exchange resin to less than 200 ppb each;

3) treating said ion exchange resin of a)1) and a)2) with electronic grade acetone to remove water, followed by treating said ion exchange resin of a)1) and a)2) with propylene glycol methyl ether acetate to remove acetone; then b) either: 1) passing a solution of novolak resin in propylene glycol methyl ether acetate at a temperature of 30° to 150° C., through the chelating ion exchange resin of a)1) or a)2) at a rate such that the residence time is more than 10 minutes and thereby reducing the level of sodium and iron ions in the novolak resin solution to less than 100 ppb each; or 2) mixing a solution of novolak resin in propylene glycol methyl ether acetate with the chelated ion exchange resin of a)1) or a)2) at a temperature from 30° to 150° C., for 1 to 80 hours, followed by filtering the novolak resin solution through 0.01 to 0.2 μm filter and thereby reducing the level of sodium and iron ions in the novolak resin solution to less than 100 ppb each.

2. The method of claim 1 wherein the sodium and iron ion level in the ion exchange resin is reduced to less than 100 ppb each.

3. A method for producing a positive photoresist composition comprising:

a)1) treating a chelating ion exchange resin in a column or in a batch process with deionized water, followed by a mineral acid solution, again treating said ion exchange resin with deionized water, and thereby reducing the level of sodium and iron ions in the ion exchange resin to less than 200 ppb each; or 2) treating a chelating ion exchange resin in a column or in a batch process with deionized water, followed by a mineral acid solution, again treating said ion exchange resin with deionized water, followed by treating said ion exchange resin with ammonium hydroxide solution and thereby converting the ion exchange resin to an ammonium salt, followed by again treating said ion exchange resin with deionized water, and thereby reducing the level of sodium and iron ions in said ion exchange resin to less than 200 ppb each;

3) treating said ion exchange resin of a)1) and a)2) with electronic grade acetone to remove water, followed by treating said ion exchange resin of a)1) and a)2) with propylene glycol methyl ether acetate to remove acetone; then b) either: 1) passing a solution of novolak resin in propylene glycol methyl ether acetate at a temperature of 30° to 150° C., through the chelating ion exchange resin of a)1) or a)2) at a rate such that the residence time is more than 10 minutes and thereby reducing the level of sodium and iron ions in the novolak resin solution to less than 100 ppb each; or 2) mixing a solution of novolak resin in propylene glycol methyl ether acetate with the chelated ion exchange resin of a)1) or a)2) at a temperature in the range of 30° to 150° C., for 1 to 80 hours, followed by filtering the novolak resin solution through a 0.01 to 0.1 μm filter and thereby reducing the level of sodium and iron ions in the novolak resin solution to less than 200 ppb each; then c) providing an admixture of:

1) a photosensitive component in an amount sufficient to photosensitize the photoresist composition;

2) the novolak resin solution of b)1 or b)2); and 3) a suitable photoresist solvent.

4. The method of claim 3 wherein the sodium and iron level in the ion exchange resin is reduced to less than 100 ppb each.

5. The method of claim 3 wherein said photoresist solvent is selected from the group consisting of propylene glycol methyl ether acetate, ethyl lactate and ethyl-3-ethoxypropionate.

6. A method for producing a semiconductor device by producing a photo-image on a suitable substrate comprising:

a)1) treating a chelating ion exchange resin in a column or in a batch process with deionized water, followed by a mineral acid solution, again treating said ion exchange resin with deionized water, and thereby reducing the level of sodium and iron ions in the ion exchange resin to less than 200 ppb each; or 2) treating a chelating ion exchange resin in a column or in a batch process with deionized water, followed by a mineral acid solution, treating said ion exchange resin again with deionzied water, followed by treating said ion exchange resin with an ammonium hydroxide solution and thereby convening the ion exchange resin to its ammonium salt, followed by again treating said ion exchange resin with said ion exchange resin water, and thereby reducing the level of sodium and iron ions in said ion exchange resin to less than 100 ppb each;

3) treating said ion exchange resin of a)1) and a)2) with electronic grade acetone to remove water, followed by treating with propylene glycol methyl ether acetate to remove acetone; then b) either: 1) passing a solution of novolak resin in propylene glycol methyl ether acetate at a temperature of 30° to 150° C., through the chelating ion exchange resin of a)1) or a)2) at a rate such that the residence time is more than 10 minutes and thereby reducing the level of sodium and iron ions in the novolak resin solution to less than 200 ppb each; or;

2) mixing a solution of novolak resin in propylene glycol methyl ether acetate with the chelated ion exchange resin of a)1) or a)2) at a temperature in the range of 30° to 150° C., for 1 to 80 hours, followed by filtering the novolak resin solution through a 0.01 to 0.1 μm filter and thereby reducing the level of sodium and iron ions in the novolak resin solution to less than 100 ppb each; then c) providing a photoresist composition by forming an admixture of:

1) a photosensitive component in an amount sufficient to photosensitize the photoresist composition;

2) the novolak resin solution of b)1) or b)2); and 3) a suitable photoresist solvent;

d) coating a suitable substrate with said photoresist composition of c);
e) heat treating the coated substrate of d) until substantially all of the solvent is removed;
f) image-wise exposing said photoresist composition; and
g) removing the image-wise exposed areas of said photoresist composition with a suitable developer.

7. The method of claim 6 wherein the sodium and iron level in the ion exchange resin is reduced to less than 100 ppb each.

8. The method of claim 6 wherein said solvent is selected from the group consisting of propylene glycol methyl ether acetate, ethyl lactate and ethyl-3-ethoxypropionate.

9. The method of claim 6 wherein said developer comprises an aqueous alkaline developer.

10. The method of claim 6 wherein the sodium and iron ion level of the novolak resin is reduced to less than 50 ppb each.

11. The method of claim 6 wherein the sodium and iron level in the ion exchange resin is reduced to less than 100 ppb each.

12. The method of claim 6 wherein said novolak resin produced has a sodium and iron ion level of less than 20 ppb each.

13. The method of claim 6 wherein said photoresist solvent is selected from the group consisting of propylene glycol methyl ether acetate, ethyl lactate and ethyl-3-ethoxypropionate.

14. The method of claim 6 wherein the novolak resin solvent and the solvent for said photoresist composition are identical.

* * * * *